United States Patent
Lee et al.

(10) Patent No.: US 8,187,504 B2
(45) Date of Patent: May 29, 2012

(54) COPPER NANOPARTICLE DISPERSION

(75) Inventors: Young Il Lee, Gyunggi-do (KR); Dong Hoon Kim, Gyunggi-do (KR); Kwi Jong Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/405,789

(22) Filed: Mar. 17, 2009

(65) Prior Publication Data
US 2010/0032615 A1    Feb. 11, 2010

(30) Foreign Application Priority Data
Aug. 5, 2008   (KR) .................. 10-2008-0076447

(51) Int. Cl.
*H01B 1/22*    (2006.01)
(52) U.S. Cl. .................. 252/512; 428/403; 428/407
(58) Field of Classification Search .................. 252/513, 252/514, 512; 428/403, 407
See application file for complete search history.

(56) References Cited

U.S. PATENT DOCUMENTS

| | | | |
|---|---|---|---|
| 2005/0089683 A1* | 4/2005 | Hattori et al. | 428/403 |
| 2006/0159603 A1* | 7/2006 | Vanheusden et al. | 423/1 |
| 2007/0034052 A1* | 2/2007 | Vanheusden et al. | 75/362 |
| 2007/0098883 A1* | 5/2007 | Itoh et al. | 427/180 |
| 2007/0160837 A1* | 7/2007 | Chikamori et al. | 428/403 |
| 2007/0290175 A1* | 12/2007 | Kim | 252/500 |
| 2008/0152913 A1* | 6/2008 | Shinbach et al. | 428/405 |
| 2008/0260995 A1* | 10/2008 | Hirakoso et al. | 428/141 |

FOREIGN PATENT DOCUMENTS
KR   10-2006-0060725 A   6/2006
KR   10-2008-0000561 A   1/2008

* cited by examiner

*Primary Examiner* — Douglas Mc Ginty
(74) *Attorney, Agent, or Firm* — McDermott Will & Emery LLP

(57) ABSTRACT

Provided is a metal nanoparticle dispersion capable of suppressing spreadability at a room temperature and drying phenomenon at heating temperature. The metal nanoparticle dispersion includes metal particles; and an organic solvent having a viscosity of 10 mPa·s or more at a room temperature and a flash point of 100° C. or above.

6 Claims, 2 Drawing Sheets

COPPER NANOPARTICLE DISPERSION

CROSS-REFERENCE TO RELATED APPLICATIONS

This application claims the priority of Korean Patent Application No. 2008-76447 filed on Aug. 5, 2008, in the Korean Intellectual Property Office, the disclosure of which is incorporated herein by reference.

BACKGROUND OF THE INVENTION

1. Field of the Invention

The present invention relates to a metal nanoparticle dispersion, and more particularly, to a metal nanoparticle dispersion capable of suppressing spreadability at room temperature and a drying phenomenon at heating temperature.

2. Description of the Related Art

Recently, a high-density, highly integrated printed circuit board has been required with an increasing demand for light, thin, short and small electronic equipment. In the case of the printed circuit board, used wires have to have their fine line width and pitch. As one of methods for embodying this fine circuit wire, a single-step inkjet printing process rather than a conventional complicated photolithographic process has been actively studied. The single-step inkjet printing process has an advantage in that its manufacturing process is very simple since an inkjet pattern is directly printed onto a substrate, and therefore the manufacturing cost is extraordinarily low.

Metal nanoparticle dispersions having a high boiling point and low viscosity are widely used in the inkjet printing method to embody a fine metal wire. A metal nanoparticle dispersion having low viscosity is desirable in consideration of the ejectability from an inkjet head, but, when the metal nanoparticle dispersion is ejected onto a substrate, it may be difficult to form a wire having fine line width due to the low viscosity of the metal nanoparticle dispersion. Viscosity of the metal nanoparticle dispersion generally depends on the viscosity of a dispersion solvent, and therefore there has been an attempt to adjust the viscosity of the metal nanoparticle dispersion by controlling the characteristics of solvents.

Therefore, a dispersion solvent, which has a high boiling point and low viscosity and shows its excellent dispersing property with respect to metal particles, is used for the metal nanoparticle dispersion for an inkjet ink so as to prevent the metal nanoparticle dispersion from being dried in an inkjet head nozzle and facilitate smooth flow of the metal nanoparticle dispersion. It has been known that the viscosity of the metal nanoparticle dispersion is preferably in a range of 20 mPa·s or less (at 20° C.), such that the metal nanoparticle dispersion has ejectability in a conventional piezo-type inkjet head.

Korean Patent Publication No. 2006-0060725 proposes a silver nanoparticle dispersion using tetradecane as a dispersion solvent. Since the dispersion solvent, tetradecane, has low viscosity of 2.0 to 2.3 mPa·s (at 20° C.), a high-concentration dispersion in which a content of silver nanoparticles is 60 wt % has low viscosity of approximately 8 mPa·s (at 20° C.). However, the silver nanoparticle dispersion including tetradecane has a disadvantage in that, since it takes several minutes to dry a wire, the deposited wire may be spread, which makes it difficult to form a fine wire.

Therefore, there has been a continuous demand for development of a metal nanoparticle dispersion that is able to control its characteristics such as viscosity by using a dispersion solvent that has excellent ejectability from an inkjet head and facilitates formation of a wire having a fine line width.

SUMMARY OF THE INVENTION

The present invention is designed to solve the problems of the prior art, and therefore it is an object of the present invention to provide a metal nanoparticle dispersion capable of suppressing spreadability at a room temperature and a drying phenomenon at a heating temperature.

According to an aspect of the present invention, there is provided a metal nanoparticle dispersion including metal particles; and an organic solvent having a viscosity of 10 mPa·s or more at a room temperature and a flash point of 100° C. or above.

In this case, the metal particles may have an average particle size of 100 nm or less, and be at least nanoparticle selected from the group consisting of gold, platinum, silver, copper, nickel, palladium, lead, tin, indium, aluminum and alloys thereof.

Also, a content of the metal particles may be in a range of 1 to 80 wt %, base on the total weight of the metal nanoparticle dispersion. In order to enhance affinity to the organic solvent, the metal particles may be capped with at least one molecule selected from the group consisting of an amine-based molecule, a fatty acid-based molecule and a thiol-based molecule.

In addition, the organic solvent that may be used herein may be in a solid state at a room temperature. The metal nanoparticle dispersion using the organic solvent may have a viscosity of 20 mPa·s or less at a temperature of 60° C. or above.

Furthermore, the organic solvent may include a fatty alcohol having at least 10 carbon atoms. Here, the fatty alcohol may be at least one selected from the group consisting of decanol, dodecanol, tetradecanol, hexadecanol and octadecanol. Also, the organic solvent may include liquid paraffin having at least 10 carbon atoms.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
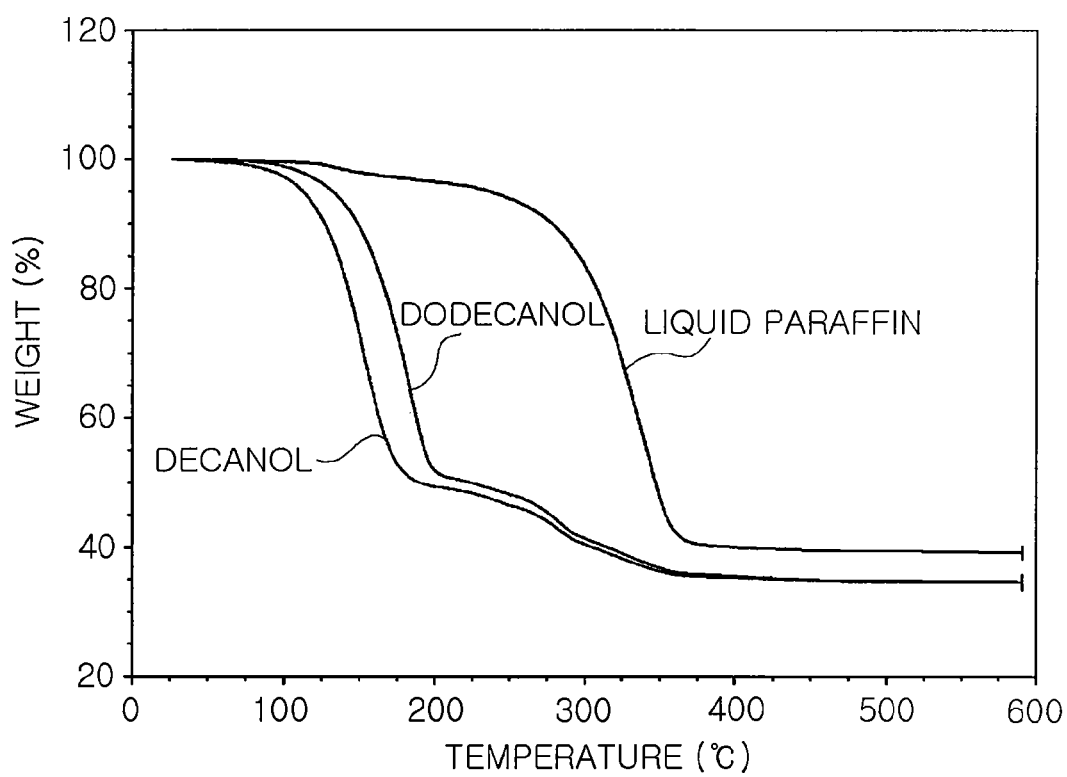
FIG. 1 is a diagram illustrating results obtained by preparing metal nanoparticle dispersions according to one exemplary embodiment of the present invention using different organic solvents and measuring contents of metal particles in the metal nanoparticle dispersions.

Hereinafter, exemplary embodiments of the present invention will now be described in detail with reference to the accompanying drawings. However, it is apparent to those skilled in the art that modifications and variations may be made without departing from the scope of the invention. Therefore, the exemplary embodiments of the present invention will be provided for the purpose of better understanding of the present invention as apparent to those skilled in the art.

The metal nanoparticle dispersion according to one exemplary embodiment of the present invention includes metal particles; and an organic solvent having viscosity of 10 mPa·s or more at a room temperature and a flash point of 100° C. or above. In accordance with the present invention, a high-viscosity metal nanoparticle dispersion may be prepared by incorporating as the dispersion solvent an organic solvent having high viscosity at a room temperature so as to embody a fine circuit wire using an inkjet printer, and a fine wire having a high aspect ratio may be prepared by suppressing spreadability of the metal nanoparticle dispersion in a wire.

In accordance with the present invention, the metal particles are preferably nanoparticles having an average particle size of 100 nm or less. Since the metal nanoparticle dispersion according to one exemplary embodiment of the present invention may be, for example, used to form a pattern of fine wires, it is more preferred that the metal particles have a smaller average particle size.

The metal particles, which may be used in the present invention, includes at least one selected from the group consisting of gold, platinum, silver, copper, nickel, palladium, lead, tin, indium and aluminum. Also, the metal particles, which may be used in the present invention, may be in at least one form selected from the group consisting of alloys of the above-listed metals, and sulfides, carbides, oxides and salts thereof.

The content of the metal particles may be in a range of 1 to 80 wt %, based on the total weight of the metal nanoparticle dispersion. When the content of the metal particles is less than 1 wt %, functions of the metal particles may not be sufficiently displayed due to the too small content of the metal particles, whereas it is difficult to adjust the viscosity of the metal nanoparticle dispersion to a desired viscosity level due to the small content of the organic solvent when the content of the metal particles exceeds 80 wt %.

In order to enhance affinity to the organic solvent, the metal particles are preferably capped with particles having affinity to the organic solvent. Particles that may be used the metal particles having affinity to the organic solvent in the present invention include, but are not particularly limited to, amine-based molecules, fatty acid-based molecules and thiol-based molecules.

In the metal nanoparticle dispersion according to one exemplary embodiment of the present invention, the organic solvent has a dispersing property with respect to the above-mentioned metal particles, and therefore the organic solvent is preferably used to prepare a high-concentration metal nanoparticle dispersion. Also, the organic solvent preferably has viscosity of 10 mPa·s or more at a room temperature (i.e. 20° C.) and a flash point of 100° C. or above. When the viscosity of the metal nanoparticle dispersion at a room temperature exceeds a predetermined viscosity, the spreadability of the metal nanoparticle dispersion may be suppressed since the metal nanoparticle dispersion has high viscosity when it is ejected.

Also, since the metal nanoparticle dispersion has a high viscosity at a room temperature, the metal nanoparticle dispersion should be heated to reduce its viscosity during the ejection process. Therefore, it is necessary to suppress a drying phenomenon in a nozzle through which the metal nanoparticle dispersion is ejected while the nozzle being heated. In this case, the organic solvent used in the metal nanoparticle dispersion according to one exemplary embodiment of the present invention preferably has a flash point of 100° C. or above so as to suppress the drying phenomenon. In addition to the flash point, the organic solvent preferably has viscosity of 20 mPa·s or less at a temperature of 60° C. or above because the metal nanoparticle dispersion has to be ejected through the nozzle when the nozzle is heated.

The dispersion solvent having a high viscosity at a room temperature includes fatty alcohols having at least 10 carbon atoms. For example, the fatty alcohol may include at least one selected from the group consisting of, but is not particularly limited to, decanol, dodecanol, tetradecanol, hexadecanol and octadecanol. Also, the organic solvent may include paraffin that is a mixture of hydrocarbons having at least 10 carbon atoms. Here, the paraffin may be liquid paraffin.

Formulas, melting points, flash points and viscosity (at a room temperature) of the fatty alcohol (for example, decanol, dodecanol, tetradecanol, hexadecanol and octadecanol) and the liquid paraffin are listed in the following Table 1. However, since the liquid paraffin is a mixture of hydrocarbons having at least 10 carbon atoms, the melting point and the flash point of the liquid paraffin are widely varied according to the mixed hydrocarbons, which makes it difficult to obtain constant melting point and the flash point of the liquid paraffin. Therefore, only the viscosity of the liquid paraffin is listed in the following Table 1.

TABLE 1

| Organic solvent | Formula | Melting point (° C.) | Flash point (° C.) | Viscosity (mPa · s, at room temp.) |
|---|---|---|---|---|
| Decanol | $C_{10}H_{22}O$ | 7 | 108 | 12.3 |
| Dodecanol | $C_{12}H_{26}O$ | 24 | 127 | 17.7 |
| Tetradecanol | $C_{14}H_{30}O$ | 38 | 145 | Solid |
| Hexadecanol | $C_{16}H_{34}O$ | 56 | 135 | Solid |
| Octadecanol | $C_{10}H_{38}O$ | 61 | 195 | Solid |
| Liquid paraffin | Mixture of hydrocarbons of at least 10 carbon atoms | — | — | 142 |

All the organic solvents have a flash point of 100° C. or above and a high viscosity of 10 mPa·s or more at a room temperature. Among the fatty alcohols, tetraalcohol, hexadecanol and octadecanol, all of which has at least 14 carbon atoms, exist in a solid state at a room temperature. Therefore, it is especially estimated that the above-mentioned fatty alcohols should be effective for suppressing spreadability of the metal nanoparticle dispersion when the metal nanoparticle dispersion is ejected.

In general, when the metal nanoparticle dispersion for an inkjet printer has viscosity of 20 mPa·s or above, the ejectability of the metal nanoparticle dispersion may be poor in the use of a conventional piezo-type inkjet head. However, the ejectability of the metal nanoparticle dispersion may be secured in the use of an internal heating head since a high-viscosity dispersion may be converted into a dispersion having a sufficient low viscosity to eject the metal nanoparticle dispersion.

Here, the preparation and applicability of a high-concentration ink including these organic solvents were confirmed in accordance with the present invention. Copper particle dispersions were prepared in Examples 1 to 6 by dispersing copper nanoparticles using organic solvents. Here, the organic solvents include decanol, dodecanol, tetradecanol, hexadecanol and octadecanol, and liquid paraffin.

Figure 2:
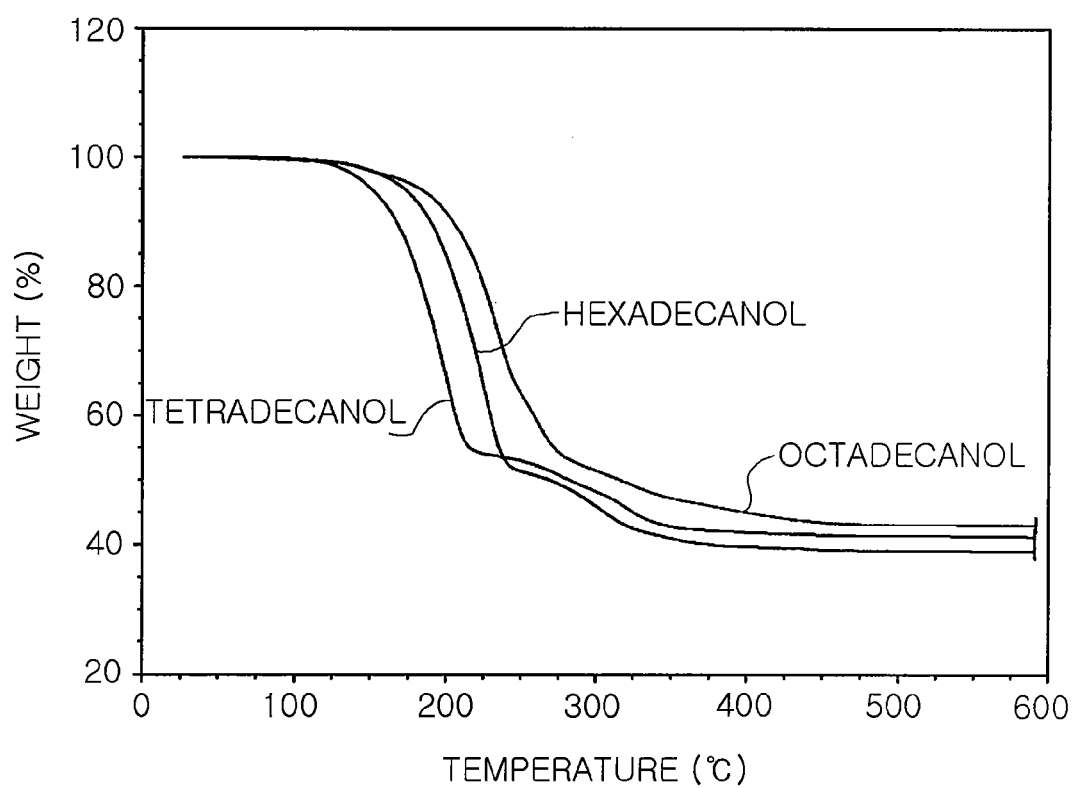
FIG. 2 is a diagram illustrating results obtained by preparing metal nanoparticle dispersions according to one exemplary embodiment of the present invention using different organic solvents and measuring contents of metal particles in the metal nanoparticle dispersions.

The copper particle dispersions prepared in Examples 1 to 6 were subject to thermal analysis to measure a pure content of metals in an ink. FIG. 1 is a diagram illustrating the thermal analysis results of the copper particle dispersions prepared in Examples 1, 2 and 6, and FIG. 2 is a diagram illustrating the thermal analysis results of the copper particle dispersions prepared in Examples 3, 4 and 5. The thermal analysis was used to measure a content of the copper particles in the prepared copper particle dispersion.

From the thermal analysis results as shown in FIG. 1, it was revealed that the copper particles is present at a content of 34.51 wt % in the copper particle dispersion of Example 1 using decanol as the organic solvent, the copper particles is present at a content of 34.61 wt % in the copper particle dispersion of Example 2 using dodecanol, and the copper particles is present at a content of 39.27 wt % in the copper particle dispersion of Example 6 using liquid paraffin.

From the thermal analysis results as shown in FIG. 2, it was revealed that the copper particles is present at a content of 39.03 wt % in the copper particle dispersion of Example 3 using hexadecanol as the organic solvent, the copper particles is present at a content of 43.01 wt % in the copper particle dispersion of Example 4 using octadecanol, and the copper particles is present at a content of 41.31 wt % in the copper particle dispersion of Example 5 using tetradecanol.

From the thermal analysis results, it was confirmed that, when each of the organic solvents is used to prepare a metal nanoparticle dispersion, the content of the copper particles in the metal nanoparticle dispersion is in range of 34 to 45%, which indicates that it is possible to prepare a metal nanoparticle dispersion having a high metal content.

Viscosities of the copper particle dispersions including decanol, dodecanol, tetradecanol and liquid paraffin according to the temperature of the copper particle dispersions are listed in the following Table 2. Here, the viscosities of the copper particle dispersions were measured by increasing the temperature of the copper particle dispersions from 25° C. to 95° C. by 5° C.

TABLE 2

| Temp. (° C.) | Decanol (mPa·s) | Dodecanol (mPa·s) | Tetradecanol (mPa·s) | Liquid paraffin (mPa·s) |
|---|---|---|---|---|
| 25 | 92 | — | — | 345 |
| 30 | 73.6 | 89.6 | — | 263 |
| 35 | 59.2 | 67.5 | — | 202 |
| 40 | 48 | 53.4 | — | 158 |
| 45 | 39.4 | 44.5 | 231 | 126 |
| 50 | 32.3 | 37.1 | 184 | 101 |
| 55 | 26.6 | 31 | 114 | 82.2 |
| 60 | 21.8 | 26.6 | 59.5 | 67.5 |
| 65 | 17.9 | 24 | 53.1 | 56.6 |
| 70 | 14.4 | 20.8 | 45.8 | 48 |
| 75 | 11.5 | 17.9 | 37.1 | 41 |
| 80 | 10.9 | 16 | 26.6 | 35.5 |
| 85 | 9.9 | 14.4 | 16 | 28.5 |
| 90 | 8.9 | 12.8 | 10.6 | 23.4 |
| 95 | — | — | — | 19.1 |

As listed in Table 2, it was revealed that, when decanol is used as the organic solvent in the copper particle dispersion, the copper particle dispersion show its viscosity of 20 mPa·s or less that is the most desirable viscosity in ejecting the copper particle dispersion. Also, it was shown that, when dodecanol, tetradecanol and liquid paraffin, which provide a higher viscosity at a room temperature than the decanol, are used as the organic solvent, the copper particle dispersions show their viscosity of 20 mPa·s or less at 75° C., 85° C. and 95° C., respectively.

However, the dodecanol and the tetradecanol have flash points of 127° C. and 145° C., and therefore the ejection stability may be secured by heating the copper particle dispersions including the dodecanol and the tetradecanol into an ejectable viscosity level. Considering the fact that the liquid paraffin does not have a secured a flash point but has a high viscosity, it is estimated that the liquid paraffin-containing copper particle dispersion has a higher flash point than the decanol-containing copper particle dispersion, and therefore it is possible to secure the ejection stability of the copper particle dispersion.

As seen from Table 2, most of the metal nanoparticle dispersions using organic solvents show their very high viscosity at a room temperature, but the viscosity of the metal nanoparticle dispersions is reduced with an increasing temperature. As a result, when the metal nanoparticle dispersions are heated to a temperature of 65° C. or above, the metal nanoparticle dispersions has a viscosity of 20 mPa·s or less that is a suitable viscosity range to eject the dispersions. Accordingly, it was confirmed that it is possible to control the ejectability of the high-viscosity ink by increasing a temperature of the inkjet head.

Therefore, the metal nanoparticle dispersion including each of the organic solvents shows its high viscosity at a room temperature, and therefore, when the metal nanoparticle dispersion is ejected after the viscosity of the metal nanoparticle dispersion is reduced to a low viscosity level by heating an inkjet head, the ejected fine droplets lose their heat while being deposited onto a substrate. In this case, the ejected fine droplets regain their high viscosity, which make it possible to suppress a spreading phenomenon of a wire. That is to say, since the fatty alcohol and the liquid paraffin having at least 10 carbon atoms have their high flash points, the drying phenomenon does not appear at the nozzle even when the inkjet head is heated to a suitable temperature level to eject the metal nanoparticle dispersion. Therefore, it is possible to secure the stable ejectability of the metal nanoparticle dispersion.

As described above, the metal nanoparticle dispersion according to one exemplary embodiment of the present invention may be useful to easily form a fine wire having a high aspect ratio in the use in the printed circuit board since the spreadability of the metal nanoparticle dispersion may be suppressed at a room temperature due to the high viscosity of the metal nanoparticle dispersion at a room temperature.

Also, the metal nanoparticle dispersion according to one exemplary embodiment of the present invention may be useful to secure the stable ejectability since the metal nanoparticle dispersion has a high flash point that is sufficient to prevent a nozzle from being dried even when the metal nanoparticle dispersion is heated and ejected from the nozzle using an inkjet process.

While the present invention has been shown and described in connection with the exemplary embodiments, it will be apparent to those skilled in the art that modifications and variations can be made without departing from the spirit and scope of the invention as defined by the appended claims.

What is claimed is:

1. A copper nanoparticle dispersion, comprising:
   copper particles; and
   an organic solvent having a viscosity greater than 10 mPa·s at a room temperature and a flash point of 100° C. or above,
   wherein the organic solvent comprises a fatty alcohol selected from the group consisting of dodecanol, tetradecanol, hexadecanol, and octadecanol.

2. The copper nanoparticle dispersion of claim 1, wherein the copper particles have an average particle size of 100 nm or less.

3. The copper nanoparticle dispersion of claim 1, wherein a content of the copper particles is in a range of 1 to 80 wt %, base on the total weight of the copper nanoparticle dispersion.

4. The copper nanoparticle dispersion of claim 1, wherein the copper particles are capped with at least one selected from the group consisting of an amine-based molecule, a fatty acid-based molecule and a thiol-based molecule.

5. The copper nanoparticle dispersion of claim 1, wherein the organic solvent is in a solid state at a room temperature.

6. The copper nanoparticle dispersion of claim 1, wherein the viscosity at a temperature of 65° C. or above is 20 mPa·s or less.

* * * * *